United States Patent [19]

Sarin et al.

[11] Patent Number: 4,844,951
[45] Date of Patent: Jul. 4, 1989

[54] METHOD FOR DEPOSITING ULTRATHIN LAMINATED OXIDE COATINGS

[75] Inventors: Vinod K. Sarin, Lexington, Mass.; Hans E. Hintermann, Ins; Gilbert Gindraux, Neuchatel, both of Switzerland

[73] Assignee: GTE Laboratories Incorporated, Waltham, Mass.

[21] Appl. No.: 114,984

[22] Filed: Oct. 30, 1987

Related U.S. Application Data

[62] Division of Ser. No. 5,002, Jan. 20, 1987, Pat. No. 4,749,629.

[51] Int. Cl.$^4$ ............................................. C23C 16/40
[52] U.S. Cl. ................................... 427/255; 427/249; 427/255.2; 427/255.3; 427/255.7; 427/419.2; 427/419.7
[58] Field of Search .................. 427/255.3, 255.2, 255, 427/249, 255.7, 419.2, 419.7

[56] References Cited

U.S. PATENT DOCUMENTS

| | | | |
|---|---|---|---|
| Re. 32,093 | 3/1986 | Hale | 427/255 |
| 3,306,768 | 2/1967 | Peterson | 427/255.3 |
| 3,511,703 | 5/1970 | Peterson | 427/255.3 |
| 4,018,631 | 4/1977 | Hale | 427/377 |
| 4,112,148 | 9/1978 | Fonzi | 427/255.3 |
| 4,282,289 | 8/1981 | Kullander et al. | 427/419.7 |
| 4,463,033 | 7/1984 | Kikuchi et al. | 427/255.3 |
| 4,576,836 | 3/1986 | Colmet et al. | 427/255.3 |
| 4,609,562 | 9/1986 | Isenberg et al. | 427/255.3 |
| 4,619,866 | 10/1986 | Smith et al. | 427/255.3 |

Primary Examiner—Sadie Childs
Attorney, Agent, or Firm—Frances P. Craig

[57] ABSTRACT

A method for depositing a wear resistant composite ceramic coating on a cemented carbide or hard ceramic substrate. A gas mixture is passed over the substrate, including a halide vapor of Al, Zr, or Y and one or more oxidizing gases at about 900°–1250° C. for the cemented carbide or about 900°–1500° C. for the ceramic and between about 1 torr and about ambient pressure. During the deposition of the oxide, a different halide of Al, Zr, or Y is pulsed into the gas mixture. The parameters are controlled to deposit a fully dense, adherent, wear resistant, laminated oxide coating about 0.3–20 microns thick on the substrate having at least three layers each about 0.1–3 microns thick and each predominantly of a different material than that of the adjacent layers. Optionally, the process may be controlled to produce at least one layer in which discrete particles of the material predominantly in an adjacent layer are present in a matrix of the predominant material of the layer.

7 Claims, 1 Drawing Sheet

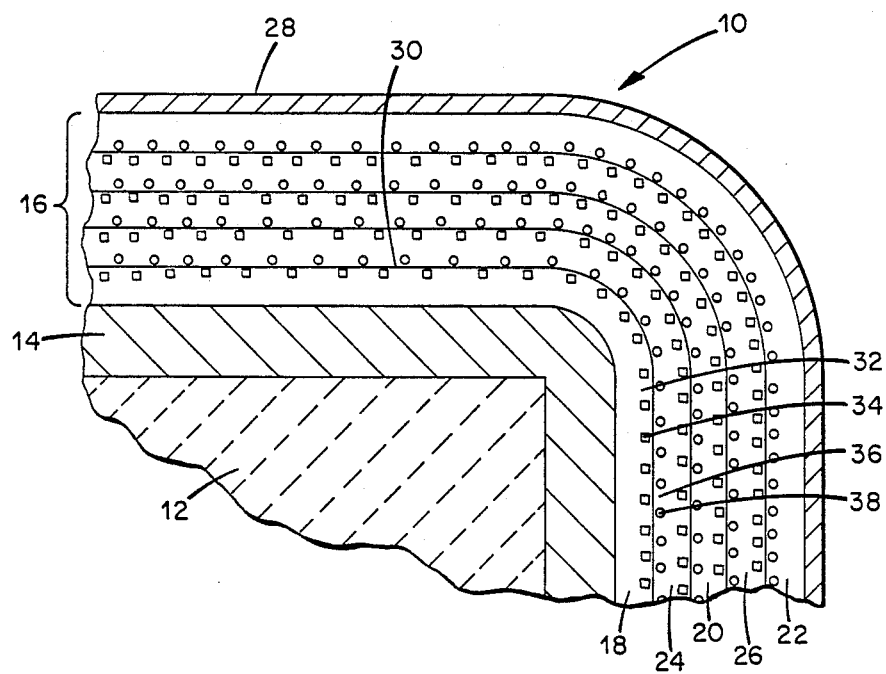

METHOD FOR DEPOSITING ULTRATHIN LAMINATED OXIDE COATINGS

This is a divisional of co-pending application Ser. No. 005,002 filed on 1/20/87, now U.S. Pat. No. 4,749,629.

THE FIELD OF THE INVENTION

This invention relates to an article comprising a wear resistant coating deposited on a hard ceramic or cemented carbide substrate, more particularly to an article having a laminated oxide coating deposited on such a substrate, and to methods for depositing the coating.

BACKGROUND OF THE INVENTION

Hard ceramic and cemented carbide materials are known and are used extensively in such applications as metal cutting, tool, and wear parts, and the like. It is also known that the service properties such as wear resistance, high temperature resistance and chemical resistance of such materials may be enhanced by the application of one or more coatings of, for example, metal carbides, metal nitrides, or ceramics. Great strides have been made in improved performance of these coated substrates, for example in machining applications, by refinement of the substrate compositions and by applying various combinations of superposed layers of coating materials. However, increasingly stringent use conditions, for example use at high cutting speeds or in extremely high temperatures and/or corrosive environments, are placing increasing demands upon the performance of such materials.

SUMMARY OF THE INVENTION

The invention described herein and recited in the appended claims provides an article and a process in which a wear resistant laminated oxide coating of ultrathin layers of controlled composition and distribution is deposited on a hard ceramic or cemented carbide substrate, the article showing improved abrasion resistance under extreme conditions of use.

A wear resistant article according to the invention comprises a hard ceramic or cemented carbide substrate body having a fully dense, adherent, wear resistant, laminated ceramic coating about 0.3-20 microns thick deposited on the substrate. The coating has at least three superimposed oxide layers, each about 0.1-3 microns thick, of materials independently selected from the oxides of aluminum, zirconium, and yttrium. Each layer is predominantly of a different material than the layers adjacent thereto.

In the preferred article according to the invention, at least one intermediate layer is deposited between the substrate body and the laminated ceramic layer. The intermediate layer is about 0.5-10 microns thick and is of one or more materials selected from the carbides, nitrides, and carbonitrides of Ti, Zr, Hf, Va, Nb, Ta, Cr, Mo, W, Si, and B. In the most preferred article according to the invention, at least one of the oxide layers ia bout 0.1-0.5 microns thick.

A process for depositing a wear resistant composite ceramic coating on a cemented carbide substrate involves passing over the substrate a first gaseous mixture of a first metal halide vapor selected from the halides of aluminum, yttrium and zirconium, with other reactant gases, and optionally a carrier gas. The reaction temperature is about 900°-1250° C. for the cemented carbide substrate, or about 900°-1500° C. for the hard ceramic substrate; the pressure between about 1 torr and about ambient pressure. The other reactant gases, the partial pressure ratios, the flow rates, and the deposition time are selected to deposit on the substrate a coating having at least two layers of a first-phase material selected from the oxides of aluminum, zirconium, and yttrium. During the deposition of the coating, at least one additional metal halide vapor selected from the halides of aluminum, zirconium, and yttrium, optionally mixed with a carrier gas is pulsed into the first gaseous mixture to mix therewith. The at least one additional metal halide vapor is different from the first metal halide vapor. At least one additional phase layer of at least one material selected from the oxides of aluminum, zirconium and yttrium is deposited within the oxide coating. The partial pressures of the metal halides and the other reactant gases, the total deposition time, and the time interval and lengths of time at which the at least one additional vapor is pulsed into the first gaseous mixture are controlled to deposit a fully dense, adherent wear resistant, laminated oxide coating about 0.3-20 microns thick on the substrate. The coating consists essentially of at least three superimposed, adherent oxide layers, each about 0.1-3 microns thick, of materials independently selected from the oxides of aluminum, zirconium, and yttrium. Each layer is predominantly of a different material than the layers adjacent thereto.

BRIEF DESCRIPTION OF THE DRAWINGS

For a better understanding of the present invention, together with the objects, advantages, and capabilities thereof, reference is made to the following disclosure and appended claims, taken together with the drawing, of which The FIGURE is a schematic cross-sectional representation of one embodiment of an article according to the invention.

DETAILED DESCRIPTION OF THE INVENTION

The article according to the present invention may be prepared by deposition of an adherent laminated oxide-based ceramic coating on a hard ceramic substrate, for example, a monolithic or composite alumina-, silicon nitride-, or silicon aluminum oxynitride-based material or related material, or a metal cemented carbide or related material. The deposition of an oxide-based coating having three or more ultrathin layers, which is adherent to the substrate, wear resistant, high temperature resistant and resistant to chemical attack or breakdown at high temperatures depends on careful control of the process parameters. The outstanding properties of the coating are a result of the one or more additional or second phase layers of $Al_2O_3$, $ZrO_2$, or $Y_2O_3$, or a combination of these, interleaved with or alternating with $Al_2O_3$, $ZrO_2$, or $Y_2O_3$ first phase layers. For example, preferred coatings include alternating ($ZrO_2$ and/or $Y_2O_3$)/$Al_2O_3$ layers, alternating $Y_2O_3$/$ZrO_2$ layers, or alternating ($Y_2O_3$ plus $ZrO_2$)/$Al_2O_3$ layers, i.e. layers of an $Y_2O_3$-$ZrO_2$ solid solution, with or without $Y_2O_3$ and/or $ZrO_2$ not in solution, alternating with $Al_2O_3$ layers. The additional phase layers may be evenly spaced throughout the coating, or their distribution may be controlled to achieve disposition at controlled intervals throughout the coating. The alternating layers are each about 0.1-3 microns thick. Preferably, at least one layer is about 0.5 microns thick. The total thickness of the coating is about 0.3-20 microns.

The preferred process for preparing the articles according to the invention, involves the use of a mixture of gases including a mixture of metal halides and other reactant gases under carefully controlled conditions to deposit by chemical vapor deposition (CVD) compounds of the metals on a substrate. A mixture of a metal halide gas, i.e. a halide of Al, Y or Zr, and other reactant gas components is passed continuously over a shaped cemented metal carbide or ceramic based substrate to deposit on oxide coating on the substrate. The other reactant gases are selected from such oxidizing gases as $CO_2$, $H_2O$ and the like. The deposition temperature for the carbide substrates is about 900°–1250° C.; that for the ceramic substrates is about 900°–1500° C. The pressure is between about 1 torr and about ambient pressure. One or more carrier gases may be included in the mixture. The reactant gases, the gas flow rates and partial pressures are selected to begin to deposit a first phase oxide coating on the substrate, the first phase oxide being an oxide of Al, Y or Zr.

During the deposition of the first phase oxide, at least one additional metal halide gas is pulsed into the gas mixture to mix therewith. The additional metal halide is selected from the halides of Al, Y or Zr, and is different from the metal halide of the first phase mixture. The partial pressure of the additional metal halide, and the pulse length and time intervals are selected to result in the formation within the oxide coating of distinct layers of an additional metal oxide phase or phases to form the laminated structure described above with reference to the article according to the invention. This laminated structure, in which ultrathin layers of one or more additional phase oxides alternate with layers of a first phase oxide to form an adherent, fully dense, wear resistant oxide coating about 0.3–20 microns thick on the substrate, is not achievable by prior art methods, and results in articles exhibiting superior wear resistance, high temperature resistance and chemical resistance.

Full control over the deposition process is achieved by control of the pulsing, i.e. the partial pressure, length and time interval of each pulse, of the metal halide gas forming the additional phase layers while maintaining continuous flow of the metal halide gas forming the first phase layers. This pulsing method provides control of the thickness and distribution of the additional phase layers within the coating. The pulses of the additional metal halide or halides are controlled so that the layers of the laminated coating are each about 0.1–3 microns thick, and preferably so that at least one layer is about 0.1–0.5 microns thick.

Some examples of laminated coatings according to the invention are: alternating $Al_2O_3/ZrO_2$ layers, alternating $ZrO_2/Y_2O_3$ layers, alternating $Y_2O_3/ZrO_2$ layers, alternating $Al_2O_3/(Y_2O_3$ plus $ZrO_2)$ layers, alternating $Al_2O_3/Y_2O_3$ layers, alternating $Al_2O_3/ZrO_2/Al_2O_3/Y_2O_3$ layers.

The term additional phase as used herein refers to laminates comprising layers of a first phase oxide compound alternating with one or more additional oxide layers, which may each be a single compound or more than one compound. Each layer may be oxides of a single metal or a mixture or solid solution of oxides or more than one metal, and the individual layers may be of the same or different compounds. The layers disclosed herein each normally exhibit a moderate to high degree of microscopic surface roughness, and a small number of microscopic gaps in the coverage of each layer are common. Such gaps do not appear to materially affect the properties of the coating, since the layers above and below the gap adherently bond to one another therethrough. Further, smoother and/or imperforate layers are not excluded from the invention.

The introduction of an additional metal halide into the continuously flowing mixture of reactive gases results in a gradual increase and decrease in the partial pressure of the additional metal halide. This may result in the formation of discrete particles of the first phase material within the matrix of an additional phase layer and/or the formation of discrete particles of an additional phase material within the matrix of a first phase layer. Thus, each layer is predominantly of one of the above-described oxide materials, the remainder being one or more of the oxides predominant in adjacent layers. The term "predominantly", as used herein, is defined as greater than 50 volume %, i.e. each layer is composed of 50 volume % of one oxide. Preferably, each layer is 90% of one oxide. Rather than being detrimental, this can result in further improvement in the properties of the coating. The advantages of such composite layers are described in commonly assigned, copending U.S. Patent applications Nos. (86-3-009), (86-3-010), (86-3-102), and (86-3-103), the relevant portions of which are incorporated herein by reference.

The coatings according to the invention are fully dense, adherent, and make it possible to combine the wear-resistant properties of two or more components without the problems associated with differences in expansion coefficients and adhesion presented by coatings of thicker layers of the materials.

In an alternate embodiment of the article according to the invention, a thin intermediate layer of TiC, TiN, or other carbide, nitride or carbonitride of Ti, Zr, Hf, Va, Nb, Ta, Cr, Mo, W, Si or B is deposited between the composite coating and the substrate. Such deposition may be achieved in known manner as a preliminary part of the same coating process, or in a separate, prior coating process. Similarly, for special applications, for example friction, cosmetic, wear, or thermal purposes, a thin outer layer such as TiN may be applied in known manner over the composite coating.

The FIGURE, not drawn to scale, schematically illustrates typical coated article 10 according to the invention. As shown in the FIGURE, substrate 12 is a shaped WC-based composite material, and may be a cutting tool or other article requiring wear resistance under the extreme conditions described above. A thin layer 14 of TiC covers the substrate, at least in the area subjected to wear. Laminated coating 16 is deposited over TiC layer 14, and is made up of ultrathin first phase layers 18, 20, and 22 predominantly of $Al_2O_3$, separated by ultrathin additional phase layers 24 and 26, predominantly of $Y_2O_3$ and $ZrO_2$ respectively. An outer layer 28 of TiN is deposited over the composite layer, giving article 10 a distinctive identifying color.

As described above, the gradual increase and decrease in the additional metal halide present in the reactant mixture with each pulse may result in the formation of each layer as a composite, especially near the interface of adjacent layers. This phenomenon is illustrated in the FIGURE, which shows discrete particles formed in each layer, of a material predominant in an adjacent layer. This will be described with respect to interface 30 between $Al_2O_3$ layer 18 and $Y_2O_3$ layer 24, but any or all of the layers of the oxide coating according to the invention may show such composite morphology. Interface 30 is represented schematically in the FIGURE by a smooth line, although normally some degree of microscopic roughness would be present at the interface, as discussed above. As shown in the FIGURE, layer 18 is made up $Al_2O_3$ matrix 32 with discrete particles, as 34, of $Y_2O_3$ dispersed therein at and near interface 30. Similarly, layer 24 is made up of $Y_2O_3$ matrix 36 with discrete particles, as 38, of $Al_2O_3$ dispersed therein at and near interface 30. Thus both layer 18 and layer 24 are ultrathin layers of a two phase composite material, layer 18 being predominantly $Al_2O_3$ and layer 24 being predominantly $Y_2O_3$. Remaining layers 20, 22, and 26 show similar composite structure, each being predominantly of a single matrix material, with discrete particles of the matrix material of an adjacent layer dispersed therein. Layer 20 is a three phase layer having an $Al_2O_3$ matrix and particles of both $Y_2O_3$, the matrix material of layer 24, and $ZrO_3$, the matrix material of layer 26, dispersed therein. Layer 20 is predominantly $Al_2O_3$, that is greater than 50% and preferably greater than 90% $Al_2O_3$.

Although the FIGURE shows layers in which the particles have formed at or near the interface, it is possible by controlling the partial pressures of the reactant gases present during the deposition of each layer, to produce one or more layers in which the particles are distributed throughout the matrix of the layer, rather than only at or near the interface with an adjacent layer. Articles including such layers, and the process by which they are produced are within the scope of this invention.

The following Example is presented to enable those skilled in this art to more clearly understand and practice the present invention. This Example should not be considered as a limitation upon the scope of the invention, but merely as being illustrative and representative thereof.

EXAMPLE

After rinsing of all gas lines with their respective gases of 0.5-1 hr, samples of cutting tool inserts of a silicon nitride-based composite material are cooked with a layer of TiC about 3 microns thick by known techniques in a CVD reactor. An excess of preweighed zirconium metal chips is placed in a separate vessel disposed in the reactor. An excess of aluminum chips is placed in a vessel outside the reactor. The reactor is evacuated to about 10 torr, then heated under low pressure, while being flushed with flowing hydrogen, to increase the outgassing before deposition. Following the deposition procedure, the reactor is cooled, at the deposition pressure and while being flushed with hydrogen, to about 300° C., then under ambient pressure and flowing nitrogen to room temperature.

The deposition reaction conditions are given in Table I, below. The halide gas is $Cl_2$, the carrier gas for the Al and Zr halide reactions is Ar, and the other reactant gas is $CO_2$ with $H_2$ as a carrier. The $Cl_2$ flow rates are adjusted to give metal chloride flow rates shown in Table I. The deposition pressure is 50 torr; the temperature, 1450° C.

As shown in Table I, a period of $Al_2O_3$ deposition of 1.0 hr is carried out before deposition of the first $ZrO_2$ layer is begun. During the deposition of the $Al_2O_3$ layer, Ar gas is allowed to flow over the Zr, but the $Cl_2$ gas flow is shut off. The coating is deposited on the TiC underlayer as a laminated structure of alternating alumina- and zirconia-based oxide composite layers, similar to that illustrated in the Figure, but with only $Al_2O_3$ and $ZrO_2$ layers, and without the TiN layer over the oxide coating. The oxide coating is made up of four $Al_2O_3$ layers separated by three $ZrO_2$ layers. The $Al_2O_3$ layers each have less than 10 wt % $ZrO_2$ as discrete particles dispersed therein at or near the oxide layer interfaces. The $ZrO_2$ layers each have less than 10 wt % $Al_2O_3$ as discrete particles dispersed therein at or near the oxide layer interfaces.

TABLE I

| | |
|---|---|
| Total Flow Rate | 1420 ccpm |
| Reactant Flow Rate | 1020 ccpm |
| Volume %: | |
| $H_2$ | 88% |
| $CO_2$ | 7% |
| $AlCl_2$ | 2.5% |
| $ZrCl_4$ | 2.5% |
| Total Deposition Time | 3.5 hr |
| $AlCl_3$ Flow Time | 0-3.5 hr |
| $ZrCl_4$ Pulse Times | 1.0-1.25 hr |
| | 1.75-2.0 hr |
| | 2.5-2.75 hr |

While there has been shown and described what are at present considered the preferred embodiments of the invention, it will be obvious to those skilled in the art that various changes and modifications can be made therein without departing from the scope of the invention as defined in the appended claims.

We claim:

1. A process for depositing a wear resistant composite ceramic coating on a cemented carbide or hard ceramic substrate comprising the steps of:

passing over the substrate a first gaseous mixture of a first metal halide vapor selected from the group consisting of halides of aluminum, yttrium and zirconium, with one or more oxidizing gases, and optionally a carrier gas, at a temperature of about 900°-1250° C. for the cemented carbide substrate, or about 900°-1500° C. for the hard ceramic substrate, at a pressure between about 1 torr and about ambient pressure, wherein the one or more oxidizing gases, the partial pressure ratios, the flow rates, and the deposition time are selected to deposit on the substrate a coating having at least two layers of a first-phase material selected from the group consisting of oxides of aluminum, zirconium, and yttrium;

during the deposition of the coating, pulsing into the first gaseous mixture to mix therewith at least one additional metal halide vapor selected from the group consisting of the halides of aluminum, zirconium, and yttrium, optionally mixed with a carrier gas, wherein the at least one additional metal halide vapor is different from the first metal halide vapor, to deposit within the oxide coating at least one additional phase layer of at least one material selected from the group consisting of oxides of aluminum, zirconium and yttrium; and controlling the partial pressures of the metal halides and the one or more oxidizing gases, the total deposition time, and the time interval and lengths of time at which the at least one additional vapor is pulsed into the first gaseous mixture, to deposit a fully dense, adherent, wear resistant, laminated oxide coating about 0.3-20 microns thick on the substrate, the coating consisting essentially of at least three superimposed, adherent oxide layers, each about 0.1-3 microns thick, of materials independently selected from the group consisting of the oxides of aluminum, zirconium, and yttrium, each layer a predominantly of a different material than the layers adjacent thereto.

2. A process according to claim 1 further comprising the step of depositing between the substrate and the oxide coating at least one intermediate layer about 0.5-10 microns thick selected from the group consisting of carbides, nitrides, and carbonitrides of Ti, Zr, Hr, Va, Nb, Ta, Cr, Mo, W, Si, and B.

3. A process according to claim 1 wherein the controlling step effects deposition of a coating in which at least one of the oxide layers is about 0.1-0.5 microns thick.

4. A process for depositing a wear resistant composite ceramic coating on a cemented carbide or hard ceramic substrate comprising the steps of:

passing over the substrate a first gaseous mixture of a first metal halide vapor selected from the group consisting of halides of aluminum, yttrium and zirconium, with one or more oxidizing gases, and optionally a carrier gas, at a temperature of about 900°-1250° C. for the cemented carbide substrate, or about 900°-1500° C. for the hard ceramic substrate, at a pressure between about 1 torr and about ambient pressure, wherein the one or more oxidizing gases, the partial pressure ratios, the flow rates, and the deposition time are selected to deposit on the substrate a coating having at least two layers of a first-phase material selected from the group consisting of oxides of aluminum, zirconium, and yttrium;

during the deposition of the coating, pulsing into the first gaseous mixture to mix therewith at least one additional metal halide vapor selected from the group consisting of the halides of aluminum, zirconium, and yttrium, optionally mixed with a carrier gas, wherein the at least one additional metal halide vapor is different from the first metal halide vapor, to deposit within the oxide coating at least one additional phase layer of at least one material selected from the group consisting of oxides of aluminum, zirconium and yttrium; and controlling the partial pressures of the metal halides and the one or more oxidizing gases, the total deposition time, and the time interval and lengths of time at which the at least one additional vapor is pulsed into the first gaseous mixture, to deposit a fully dense, adherent, wear resistant, laminated oxide coating from 0.3-20 microns thick on the substrate, the coating consisting essentially of at least three superimposed, adherent oxide layers, each about 0.1-3 microns thick, of materials independently selected from the group consisting of the oxides of aluminum, zirconium, and yttrium, each layer being predominantly of a different material than the layers adjacent thereto, and wherein at least one layer includes discrete particles of at least one material predominant in a layer adjacent thereto.

5. A process according to claim 4 wherein the controlling step effects deposition of a coating consisting essentially of five layers, three imperforate first-phase layers of one of the oxide materials being interleaved with two additional phase layers of materials independently selected from the remaining of the oxide materials.

6. A process according to claim 4 further comprising the step of depositing between the substrate and the oxide coating at least one intermediate layer about 0.5-10 microns thick selected from the group consisting of carbides, nitrides, and carbonitrides of Ti, Zr, Hf, Va, Nb, Ta, Cr, Mo, W, Si, and B.

7. A process according to claim 4 wherein the controlling step effects deposition of a coating in which at least one of the oxide layers is about 0.1-0.5 microns thick.

* * * * *